US011221361B2

(12) United States Patent
Messier et al.

(10) Patent No.: US 11,221,361 B2
(45) Date of Patent: Jan. 11, 2022

(54) CONTROLLING POWER DISSIPATION IN AN OUTPUT STAGE OF A TEST CHANNEL

(71) Applicant: Teradyne, Inc., North Reading, MA (US)

(72) Inventors: Jason A. Messier, Winchester, MA (US); Bryce M. Wynn, Cambridge, MA (US); William Bowhers, Woburn, MA (US)

(73) Assignee: TERADYNE, INC., North Reading, MA (US)

( * ) Notice: Subject to any disclaimer, the term of this patent is extended or adjusted under 35 U.S.C. 154(b) by 166 days.

(21) Appl. No.: 16/559,267

(22) Filed: Sep. 3, 2019

(65) Prior Publication Data

US 2021/0063474 A1    Mar. 4, 2021

(51) Int. Cl.
*G01R 31/00* (2006.01)
*G01R 31/28* (2006.01)

(52) U.S. Cl.
CPC .................. *G01R 31/2839* (2013.01)

(58) Field of Classification Search
CPC ............ G01R 31/2839; G01R 31/2834; G01R 31/2851; G01R 31/318538; G01R 31/31905; G01R 31/3167; G01R 31/2844; G01R 31/2889; G01R 31/2874; G01R 31/2806; G01R 31/2808; G01R 31/2884; G01R 31/2827; G01R 31/3004; G01R 31/3008; G01R 31/3175; G01R 31/31701; G01R 31/31924; G01R 31/31922; G01R 31/2831; G01R 31/2812; G01R 31/2822; G01R 31/2825; G01R 31/2886; G01R 31/3025; G01R 31/31723; G01R 31/3641
See application file for complete search history.

(56) References Cited

U.S. PATENT DOCUMENTS

| 4,605,894 A * | 8/1986 | Cox ................. G01R 31/31924 324/537 |
| 4,792,932 A | 12/1988 | Bowhers et al. |
| 6,133,725 A | 10/2000 | Bowhers |
| 6,489,797 B1 * | 12/2002 | MacDonald ..... G01R 31/31924 324/756.05 |
| 6,522,723 B1 * | 2/2003 | Miller .................... H04M 3/30 379/27.01 |
| 6,675,117 B2 | 1/2004 | Adam et al. |

(Continued)

FOREIGN PATENT DOCUMENTS

JP    2019-512752 A    5/2019

OTHER PUBLICATIONS

Grace, J.W. et al., Integrated Pin Electronics for Automatic Test Equipment, Hewlett-Packard Journal, 42-50 (Oct. 1994).

(Continued)

*Primary Examiner* — Thang X Le
(74) *Attorney, Agent, or Firm* — Burns & Levinson LLP

(57) ABSTRACT

An example test system includes an output stage to source at least one of voltage or current to a channel of a test instrument; a tracking circuit to detect a channel voltage following the output stage and to control a supply voltage to the output stage based on the channel voltage; and a controller to determine a power dissipation of the output stage based on the supply voltage and the channel voltage, and to control the output stage based on the power dissipation in the output stage.

26 Claims, 3 Drawing Sheets

(56) References Cited

U.S. PATENT DOCUMENTS

| | | | |
|---|---|---|---|
| 6,927,591 B2 * | 8/2005 | McCord | G01R 31/318505 |
| | | | 324/754.07 |
| 7,327,816 B2 | 2/2008 | Messier | |
| 7,336,748 B2 | 2/2008 | Messier | |
| 7,523,238 B2 | 4/2009 | Messier | |
| 8,144,040 B2 | 3/2012 | Messier et al. | |
| 8,193,956 B2 | 6/2012 | Messier | |
| 9,257,917 B1 | 2/2016 | Filardo et al. | |
| 2002/0072870 A1 | 6/2002 | Adam et al. | |
| 2005/0135524 A1 | 6/2005 | Messier | |
| 2005/0135525 A1 | 6/2005 | Messier | |
| 2007/0005282 A1 | 1/2007 | Messier | |
| 2007/0055359 A1 | 3/2007 | Messer et al. | |
| 2009/0168575 A1 | 7/2009 | Messier | |
| 2009/0195303 A1 | 8/2009 | Bowhers | |
| 2010/0231250 A1 * | 9/2010 | Breinlinger | G01R 31/2889 |
| | | | 324/750.08 |
| 2011/0001644 A1 | 1/2011 | Messier | |
| 2011/0001645 A1 | 1/2011 | Messier et al. | |
| 2014/0375393 A1 * | 12/2014 | Funahashi | H03F 3/211 |
| | | | 332/155 |
| 2016/0268910 A1 | 9/2016 | Xu et al. | |
| 2016/0336855 A1 | 11/2016 | Ozanoglu et al. | |
| 2018/0059172 A1 * | 3/2018 | Pounds | G01R 19/16538 |
| 2018/0239379 A1 * | 8/2018 | Zhang | G05F 1/461 |
| 2019/0140032 A1 | 5/2019 | Messier et al. | |

OTHER PUBLICATIONS

Keysight Technologies, Current-voltage (IV) curve measurement fundamentals by using source/measure unit (SMU), Keysight (formerly Agilent's Electronic Measurement), 3 pages (2000-2019). URL: https://www.keysight.com/main/editorial.jspx?ckey=2317324&id=2317324&nid=-.

International Search Report for International Application No. PCT/US2020/048897, (dated Dec. 18, 2020), 4 pages.

Written Opinion for International Application No. PCT/US2020/048897, (dated Dec. 18, 2020), 5 pages.

* cited by examiner

CONTROLLING POWER DISSIPATION IN AN OUTPUT STAGE OF A TEST CHANNEL

TECHNICAL FIELD

This specification describes example implementations of a test system configured to control power dissipation in an output stage of a test channel.

BACKGROUND

Test systems are configured to test the operation of electronic devices, such as microprocessors and memory chips. Testing may include sending signals to a device and determining how the device reacted to those signals based on its response. For example, testing may include forcing voltage and current onto a test channel and receiving signals from the device based on the forced voltage and current. The device's reaction will dictate whether the device has passed or failed testing.

SUMMARY

An example test system includes an output stage to source at least one of voltage or current to a channel of a test instrument; a tracking circuit to detect a channel voltage following the output stage and to control a supply voltage to the output stage based on the channel voltage; and a controller to determine a power dissipation of the output stage based on the supply voltage and the channel voltage, and to control the output stage based on the power dissipation in the output stage. The example test system may include one or more of the following features, either alone or in combination.

Controlling the supply voltage may include adjusting the supply voltage to track variations in the channel voltage. The output stage may operate based on an overhead voltage. Controlling the supply voltage may include limiting the supply voltage to a value that is based on a sum of the channel voltage and the overhead voltage. The value of the supply voltage may be equal to the sum of the channel voltage and the overhead voltage.

The example test system may include a current sensor to detect an output current from the output stage. The controller may include a compensator circuit configured to determine the power dissipation based also on the output current. The compensator circuit may be configured to determine the power dissipation by performing operations comprising: obtaining a difference voltage between the supply voltage and the channel voltage, and obtaining a product of the output current and the difference voltage. The compensator circuit may be configured to determine the power dissipation over time and to determine whether the power dissipation is acceptable for the time. The output stage may be controlled based on whether the power dissipation is acceptable for the time. The compensator circuit may be configured to control the output stage by interrupting operation of the output stage in response to the power dissipation exceeding an acceptable limit for a period of time. The compensator circuit may be configured to compare the power dissipation to a predefined power dissipation and, if the power dissipation exceeds the predefined power dissipation, to control the output stage by interrupting operation of the output stage.

The tracking circuit may be configured to provide an input voltage to the output stage. The at least one of voltage or current sourced onto the channel by the test system may be based on the input voltage. Controlling the output stage may include changing the input voltage based on the power dissipation. The tracking circuit may be configured to change the supply voltage in a duration measured within single or double digit microseconds of the channel voltage being tracked changing. The tracking circuit may be configured to control the supply voltage to limit a voltage differential between the supply voltage and the channel voltage.

The voltage sourced may be at least 100 volts and the current sourced may be at least 2 amperes pulsed. A size of the output stage may be proportional to a difference between the supply voltage and the channel voltage at a maximum current through the output stage. A reduction in a difference between the supply voltage and the channel voltage at the maximum current may enable a reduction in a size of the output stage. The smaller the output stage is in size, the less power dissipation that the output stage will tolerate. A maximum power dissipation of the output stage may be based on the supply voltage, the channel voltage, and a current from the output stage.

An example test system includes test instruments to send signals to, and to receive signals from, a device under test (DUT). Each test instrument may include one or more channels. A channel among the one or more channels may include an output stage to source at least one of voltage or current. A device interface board (DIB) may be for connecting one or more of the test instruments to the DUT both electrically and mechanically. A computing system may be configured—for example, programmed—to control operation of one or more of the test instruments. The channel may include a tracking circuit to limit a voltage differential between a supply voltage to the output stage and a channel voltage on the channel; and a controller to control the output stage based on a power dissipation in the output stage. The example test system may include one or more of the following features, either alone or in combination.

The output stage may be configured to receive an input voltage and to source at least one of the voltage or the current based on the input voltage. The controller may be configured to control the output stage by changing the input voltage. The controller may include a compensator circuit that is configured to determine the power dissipation in the output stage by performing operations comprising: obtaining a difference voltage between the supply voltage and the channel voltage, and obtaining a product of the difference voltage and a channel current on the channel. The controller may be configured to determine the power dissipation over time and to determine whether the power dissipation is acceptable for the time. The controller may be configured to control the output stage based on whether the power dissipation is acceptable. The controller may be configured to control the output stage by interrupting operation of the output stage in response to the power dissipation exceeding an acceptable limit for a period of time. The controller may be configured to compare the power dissipation to a predefined power dissipation and, if the power dissipation exceeds the predefined power dissipation, to control the output stage by interrupting operation of the output stage. Interrupting operation of the output stage may include adjusting input of voltage to the output stage from the controller.

A size of the output stage may be proportional to a difference between the supply voltage and the channel voltage at a maximum current through the output stage. A reduction in a difference between the supply voltage and the channel voltage at the maximum current may enable a reduction in a size of the output stage. The smaller the output stage is in size, the less power dissipation that the output stage will tolerate, with a maximum power dissipation of the output stage being based on the supply voltage, the channel voltage, and a current from the output stage.

Any two or more of the features described in this specification, including in this summary section, may be combined to form implementations not specifically described in this specification.

At least part of the test systems and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the test systems and processes described in this specification may be configured or controlled using a computing system comprised of one or more processing devices and memory storing instructions that are executable by the one or more processing devices to perform various control operations.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Figure 1:
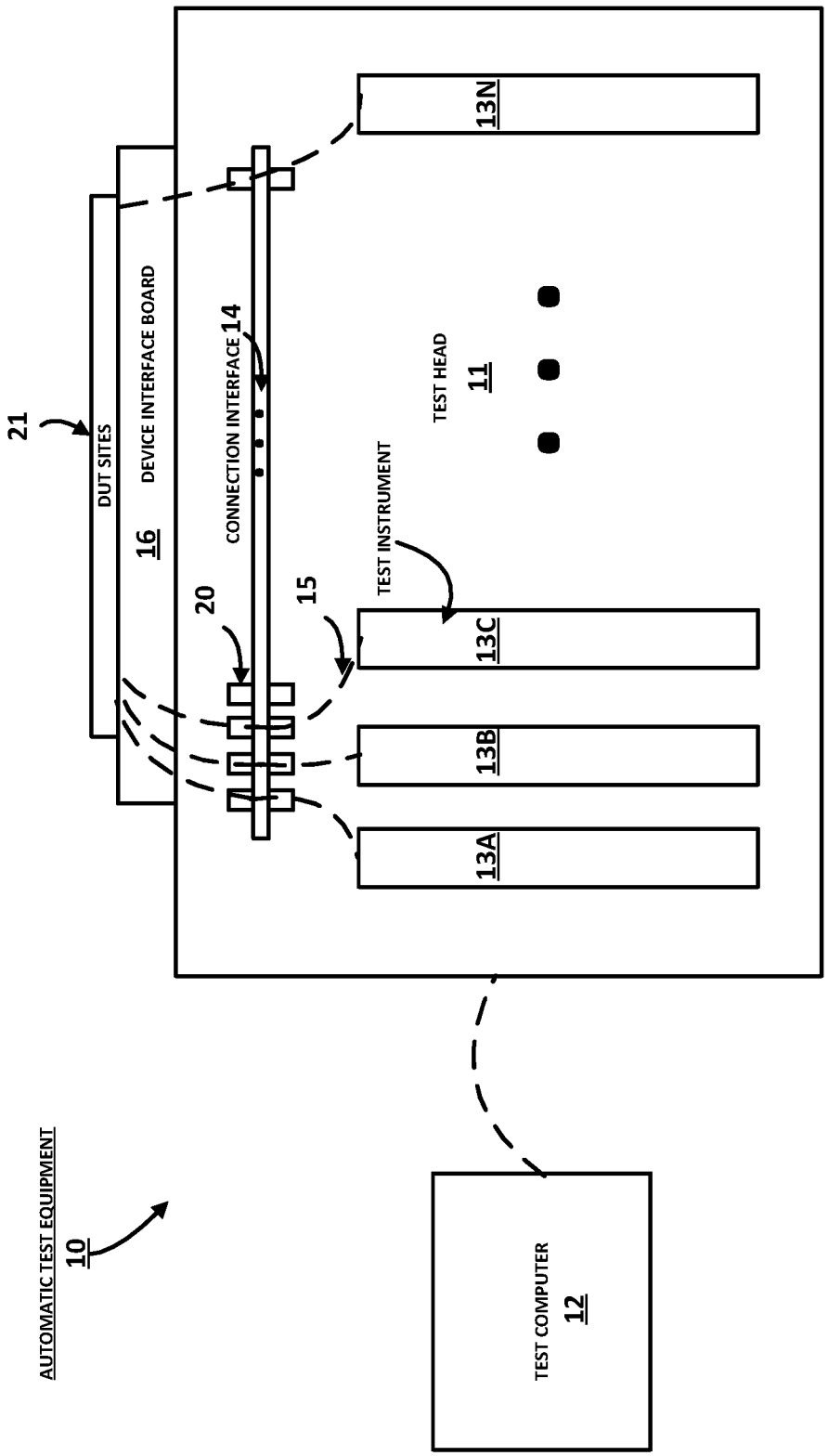
FIG. 1 is a block diagram of an example test system.

Described herein are example implementations of test systems configured to control power dissipation in output stages of test channels. In some cases, a test channel includes the physical medium or media over which signals are sent from a test system to a device under test (DUT) and over which signals are received from the DUT. The test channel includes electrically-conductive media at least part-way between the test system and the DUT. The test channel may also include wireless media or optical media part-way between the test system and the DUT.

Each example test channel includes an output stage. In some implementations, the output stage includes power amplifier circuitry—also referred to herein as "power amplifier"—to force voltage (V) and current (I) to the test channel. For example, a user may specify a voltage or current to be provided on the test channel. A controller is configured to provide input to the output stage to control the amount of voltage or current that the output stage provides to the test channel based on the user's specifications. Examples of the controller include a compensator circuit, which may be or include an analog compensator circuit or a digital compensator circuit.

The output stage also receives a supply voltage. The supply voltage includes a voltage that powers the output stage. The supply voltage is different from the received input used to control the voltage or current output to the test channel.

Generally, the physical size of the output stage is proportional to the power dissipation in the output stage. The power dissipation in the output stage is based on a difference between the supply voltage provided to the output stage and a voltage on the test channel provided by the output stage at a maximum current from the output stage. Maximum current is used in this calculation because that results in a maximum power dissipation that should be supported by the output stage for different voltages.

Traditionally, the magnitude of the supply voltage was set to accommodate a large range of voltage and current outputs by the output stage. In an example, the supply voltage for an output stage might be 110 volts (V). In some cases, however, the output stage may need to be controlled to output only 2V onto the test channel. The power dissipation in the output stage is based on the difference between 110V and 2V. In an example, where the current through the output stage is 1 ampere (A), the power dissipation in the output stage is (110V−2V)*(1 A), which is 108 watts (W). In order to accommodate power dissipations of such magnitude, the output stage was made relatively large. Output stages that are greater in size can support greater power dissipations. Output stages that are too small for a given power dissipation will be damaged by the power dissipation. Accordingly, in the preceding example, the output stage may occupy an area of 1000 square millimeters ($mm^2$) on a printed circuit board (PCB) connected to the test channel.

Large-scale output stages can limit the amount of devices that can be tested by the test system because large-scale output stages occupy greater space. To achieve higher-density testing, the size of the output stage can be reduced. To this end, the example test system described herein employs a tracking circuit to detect an output voltage provided by the output stage and to control a supply voltage to the output stage based on the output voltage. In an implementation, the tracking circuit is or includes an envelope tracker that detects the channel voltage following the output stage and that adjusts the supply voltage to the output stage. The detecting and adjusting are performed at a rapid rate, thereby enabling the envelope tracker and the output stage to react quickly enough to limit output stage power dissipation duration. For example, the detecting and adjusting may be performed in single digit microseconds (µs) or in double digit microseconds (µs).

Using the values in the foregoing example, the envelope tracker may detect 2V on the test channel at or following the output of the output stage. The envelope tracker, within the span of single or double digit microseconds in some examples, adjusts the supply voltage in order to reduce the power dissipation in the output stage. For example, the envelope tracker may change the supply voltage from 110V to 6.5V. In this regard, due to overhead voltage—also called "headroom voltage"—the circuitry that implements the output stage requires a certain excess supply voltage to achieve a target output voltage. In this example, 6.5V of supply voltage is required for the output stage to provide 2V on the test channel. In this example, the power dissipation in the output stage is (6.5V−2V)*(1 A) (where 1 A is the maximum current output from the output stage). So, the power dissipation in the output stage is 4.5 W. The magnitude of this dissipation is considerably less than the 108 W produced in the example above. As a result, the size of the output stage can be reduced relative to the 108 W example. In some implementation, the output stage can be reduced in size to about 50 $mm^2$; however, any appropriate size reductions may be achieved.

In another example, to illustrate the same effect using a high voltage output from the output stage, assume that the output stage is programmed to output 90V onto the test channel. The envelope tracker may detect 90V on the test channel at or following the output of the output stage. The envelope tracker, within the span of single or double digit microseconds, adjusts the supply voltage in order to reduce the power dissipation in the output stage. For example, the envelope tracker may change the supply voltage from 110V to 94.5V. As above, due to overhead voltage the circuitry that implements the output stage requires a certain excess supply voltage to achieve a target channel voltage. The overhead voltage may not be the same for all channel voltages; however, for this example, the overhead voltage is assumed to be 4.5V. So, in this example, a 94.5V supply voltage is required for the output stage to provide 90V on the test channel. The power dissipation in the output stage is (94.5V−90V)*(1 A) (where 1 A is the maximum current as above). So, the power dissipation in the output stage remains 4.5 W even though a larger voltage output is used. As a result, the size of the output stage can stay the same or similar for channel voltage magnitudes within a wide range. So, by adjusting the supply voltage, the size of the output stage can be reduced without reducing the range of voltage outputs that the test system can provide. In other words, a reduction in a difference between the supply voltage and the channel voltage at the maximum current enables a reduction in a size of the output stage.

Reductions in the size of the output stage can have consequences. For example, smaller-sized output stages can be more susceptible to damage than larger-sized output stages. As explained previously, an output stage that is reduced in size, can handle less power dissipation. Generally, the smaller the output stage is in size, the less power dissipation that the output stage can tolerate. In an example, an accidental short circuit may result in a spike in voltage applied to the output stage. As a result, the power dissipation in the output stage may increase beyond that which the output stage can accommodate without failing. To address this potential issue, the compensator circuit is configured to compare the power dissipation in the output stage to a predefined power dissipation and, if the power dissipation in the output stage exceeds the predefined power dissipation, to control the output stage by, for example, changing the input to the output stage or by interrupting operation of the output stage. For example, the compensator circuit may be configured—e.g., programmed, structured, or both programmed and structured—to determine the power dissipation in the output stage by obtaining a difference between the supply voltage and a channel voltage on the test channel, and by obtaining the power dissipation based on this difference. The compensator circuit may be configured to control the output stage based on the power dissipation within single digit microseconds, for example, within 1 µs. In some examples, the compensator circuit may be configured to control the output stage based on the power dissipation within double digit microseconds FIG. 1 shows components of example automatic test equipment (ATE) 10 that is configured to control power dissipation in an output stage of a test channel using the example techniques described herein. Notably, however, the techniques described herein are not limited to use with the ATE of FIG. 1 or to use in testing applications, but rather may be used in any appropriate technical context. In FIG. 1, the dashed lines represent possible signal paths between devices and not actual wiring.

ATE 10 includes a test head 11 and a test computer 12. Test head 11 interfaces to the DUTs (not shown) on which tests are performed. Test computer 12 communicates with test head 11 to control testing. For example, test computer may download test program sets to test instruments on the test head, which then run the test program sets to test DUTs in communication with the test head. Computer 12 may also present users with options to set the voltage and current on a test channel. In this regard, multiple test channels—for example, each test channel—may include an instance of the output stage power amplifier circuitry, one or more processing devices dedicated to that test channel, or both an instance of the output stage power amplifier circuitry and one or more dedicated processing devices. Examples of types of processing devices that may be used are described herein.

ATE 10 includes test instruments 13A to 13N. In this example, one or more of the test instruments are VI (voltage-current) test instruments configured to force direct current (DC) voltage and to force DC current onto a test channel and to receive signals from the device based on the forced DC voltage and forced DC current. However, other types of test instruments may be used in lieu of, or in addition to, VI test instruments. For example, test instruments may be used that are configured to produce alternating current (AC) voltage and/or AC current signals having frequencies that are greater than 1 kilohertz (KHZ). Each test instrument may be configured to output test signals to test a DUT, and to receive signals from the DUT. The signals received may include response signals that are based on the test signals and/or signals that originate from the DUT that are not prompted by (e.g., are not in response to) test signals.

Signals may be sent to, and received from, the DUT over multiple test channels. As noted, a test channel may include the physical transmission medium or media over which signals are sent from the test instrument to a DUT and over which signals are received from the DUT. Physical transmission media may include, but are not limited to, electrical conductors alone or in combination with optical conductors, wireless transmission media, or both optical conductors and wireless transmission media. In some examples, a test channel may include a range of frequencies over which signals are transmitted over one or more physical transmission media.

ATE 10 includes a connection interface 14 that connects test instrument test channels 15 to a DIB 16. Connection interface 14 may include connectors 20 or other devices for routing signals between the test instruments and DIB 16. For example, the connection interface may include one or more circuit boards or other substrates on which such connectors are mounted. Conductors that define the instrument test channels may be routed through the connection interface and the DIB.

In the example of FIG. 1, DIB 16 connects, electrically and mechanically, to test head 11. The DIB includes sites 21, which may include pins, conductive traces, or other points of electrical and mechanical connection to which DUTs may connect. Test signals, response signals, and other signals pass via the test channels over the sites between the DUT and test instruments. DIB 16 also includes, among other things, connectors, conductive traces, and circuitry for routing signals between the test instruments, DUTs connected to sites 21, and other circuitry.

Figure 2:
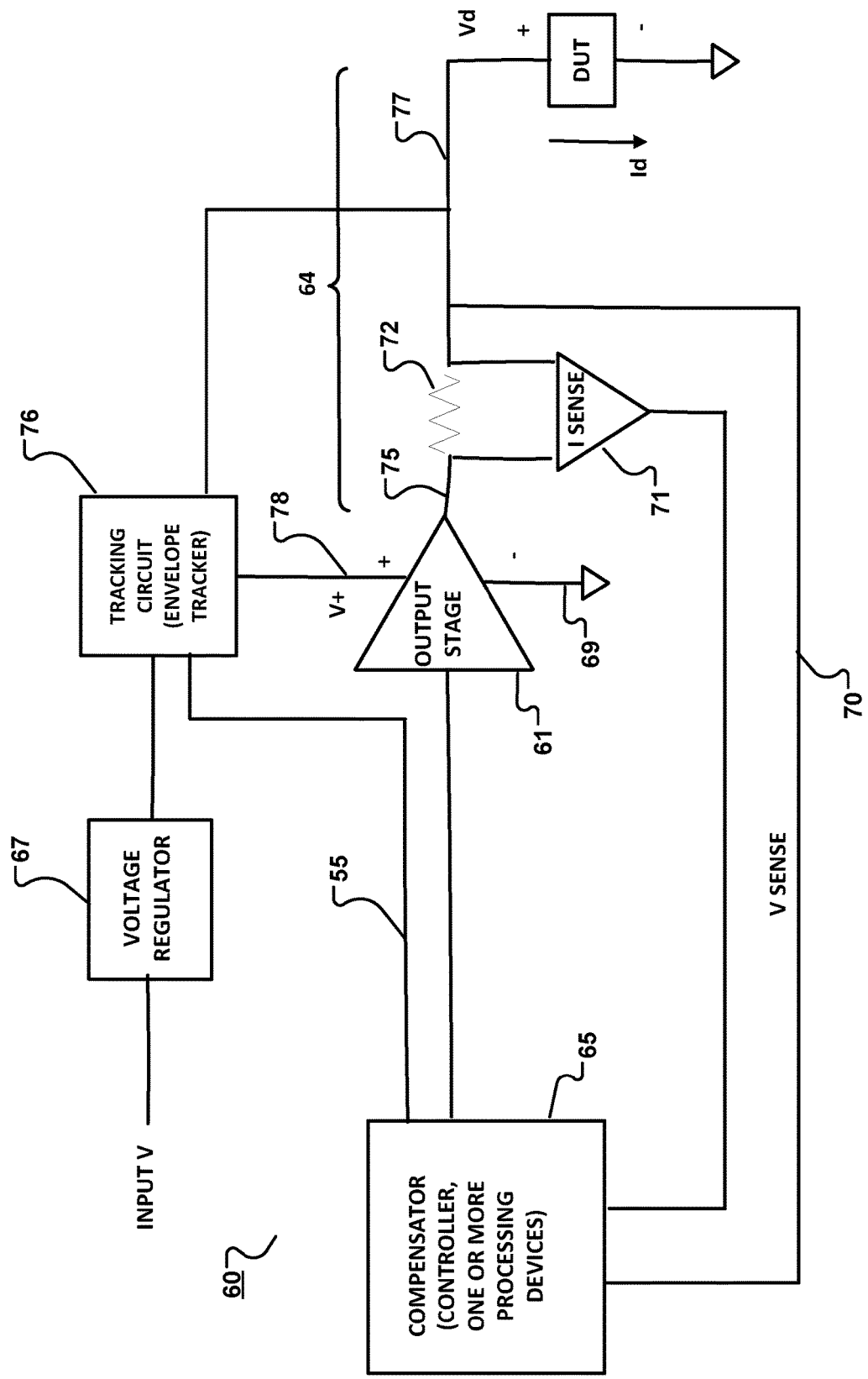
FIG. 2 is a block diagram of components included in an example test channel of the test system of FIG. 1.

FIG. 2 shows example of components that may be included in the output stage of an example test channel 60, which may be a test channel that is part of and/or connected to test instrument 13A for example. As shown in FIG. 2, test channel 60 includes output stage 61. The output stage may include a power amplifier configured to force voltage and current to the transmission media portion 64 of the test channel. The test channel also includes one or more processing devices 65 configured to control the output stage as described herein. For example, the processing devices may implement a controller, such as a digital compensator circuit, to control the output stage to produce programmed voltage or current on the test channel and/or to adjust or to interrupt operation of the output stage in response to an unsustainable power dissipation in the output stage. In some implementations the digital compensator circuit implements or includes a proportional-integral-derivative (PID) control loop to control operation of the output stage. In some implementations the digital compensator circuit implements or includes feedforward components making it not solely a PID control loop.

Voltage regulator 67 provides a voltage on which the supply voltage is based. The voltage regular may be a static voltage that is capable of outputting only a single DC voltage or a programmable voltage source that is capable of being programmed to provide one or more voltages within a range of voltages. For example, the voltage regulator may supply a high voltage, such as 110V, or any other appropriate voltage. Tracking circuit 76 may be or include an envelope tracker configured to track voltage (Vd) on the test channel and to control the supply voltage to the output stage based on that voltage. For example, the tracking circuit may control the supply voltage (V+) by adjusting the voltage from the voltage regulator. For example, the voltage from the voltage regulator may be adjusted by the tracking circuit to a value that is greater than or equal to a sum of channel voltage Vd and the overhead voltage of the output stage. In some implementations, the envelope tracker may be configured to limit or to minimize a voltage differential between the supply voltage V+ and the channel voltage Vd on the test channel while maintaining the necessary overhead voltage for operation of the output stage. In some implementations, there may be a second envelope tracker (not shown) connected the ground side 69 of the output stage in order to adjust a lower supply voltage to the output stage in cases where the lower supply voltage is not electrical ground.

The envelope tracker may limit or minimize the voltage differential by detecting the voltage on the test channel (Vd) 77 and by adjusting the voltage provided by the voltage regulator to produce the supply voltage (V+) 78. As noted, in some implementations, the resulting supply voltage is greater than or equal to the sum of the voltage (Vd) on the test channel (for example, the channel voltage following the output stage) and the overhead voltage of the output stage. Keeping the supply voltage close to this sum limits or minimizes the power dissipation in the output stage, thereby enabling use of an output stage that has a smaller or minimized size.

The envelope tracker may also control the supply voltage by adjusting the supply voltage to track variations in the channel voltage. By doing this, the envelope tracker may reduce or minimize the difference between the channel voltage and the supply voltage for different channel voltages, thereby reducing, minimizing, or keeping consistent the output stage's power dissipation.

In some implementations, the envelope tracker may take into account the voltage drop across resistor 72 and/or any other voltage drops on the test channel when controlling the supply voltage. For example, the envelope tracker may determine the voltage at point 75 by adding to Vd the voltage drop that occurred across resistors and other voltage drops that occurred before the point at which Vd is measured. In some implementations, the envelope tracker may detect the voltage Vd directly at point 75 rather than after resistor 72. As noted, the envelope tracker also takes the overhead voltage of the output stage into account when setting the supply voltage. Generally, the larger the difference is between the channel voltage and the supply voltage, the large the size that the output stage will be.

In some implementations, the tracking circuit—for example, the envelope tracker—may be implemented using a buck regulator that tracks the channel voltage and that updates the supply voltage within a time span measured in single digit microseconds, for example, 1 µs, 2 µs, 3 µs, 4 µs, 5 µs, 6 µs, 7 µs, 8 µs, or 9 µs. Speeds such as this may be implemented in a buck regulator by using inductors having relatively large inductances and a capacitor having a relatively small capacitance. In some implementations, the tracking circuit—for example, the envelope tracker—may be implemented using a buck regulator that tracks the channel voltage and that updates the supply voltage within a time span measured in double digit microseconds, for example, 10 µs, 20 µs, 30 µs, 40 µs, 50 µs, 60 µs, 70 µs, 80 µs, 90 µs or any appropriate time span that is less than 100 µs.

In FIG. 2, the power dissipation in the output stage 61 is equal to or proportional ("~") to the following voltages and current shown in the figure.

$$\text{Power Dissipation} \sim ((V+)-(Vd))*(Id),$$

where Vd is the voltage on the test channel, Id is the current drawn by the DUT, and V+ 78 is the supply voltage regulated by the envelope tracker.

In some implementations, a user may select or program a voltage to output and the test system may automatically determine a current based on that voltage. And, in some implementations, the user may select the current and the system may automatically determine the voltage. The compensator circuit may then control the power amplifier, the envelope tracker, or both, to force the voltage and current to the test channel. As explained, V+ is adjusted by the envelope tracker based on the voltage that the envelope tracker detects on the test channel—in this example, Vd. By reducing or minimizing the difference between V+ and Vd while maintaining sufficient overhead voltage for the output stage to produce the required voltage output, the size of the output stage can be reduced relative to traditional implementations.

The compensator circuit may be part of a control loop that includes the envelope tracker, the output stage, voltage sensors, and current sensors. For example, the output stage may be configured for control by compensator circuit—which may be implemented by one or more processing devices 65—to output, to the transmission media portion 64 of the test channel, current and voltage based on input current or voltage from the compensator circuit. A voltage sensor 70 (VSENSE) senses the voltage on the transmission media portion 64 of the test channel and provides the magnitude of the sensed voltage to the compensator circuit. A voltage sensor 55 senses the supply voltage and provides the magnitude of the supply voltage to the compensator circuit. A current sensor 71 (ISENSE) senses the current through—in this example, a resistor 72—on the transmission media portion 64 of the test channel and provides the magnitude of the sensed current to the compensator circuit. In this example, analog-to-digital converters (not shown) or digitizers generate digital values for the sensed voltages and the sensed current. The compensator circuit determines the power dissipation in the output stage by performing operations that include obtaining a difference voltage between the supply voltage (V+) and the channel voltage on the test channel (Vd), and obtaining the power dissipation by determining a product of the current output current (I) from the output stage and the difference voltage. The compensator circuit is configured to determine the power dissipation in the output stage and to control the output stage based on the power dissipation within single digit microseconds such as 1 µs or within double digit microseconds. For example, the compensator circuit may be configured to compare the power dissipation to a predefined power dissipation and, if the power dissipation exceeds the predefined power dissipation, to control the output stage by interrupting operation of the output stage or by adjusting an input to the output stage. For example, the compensator circuit may control the output stage by reducing a current or voltage input to the output stage by 10%, 20%, 30%, 40%, 50%, 60%, 70%, 80% or 90% for a period of time. The components of the compensator circuit to protect the output stage in the event of a fault condition such as those described herein are referred to as a "Joule clamp".

In some implementations, a given output stage may be able to function properly for short periods of time in the presence of excessive power dissipation. In an example, an output stage will not be damaged or destroyed if there is a 10 W power dissipation for a period of 20 µs or less. However, in this example, the output stage may be damaged or destroyed if there is a 10 W power dissipation for a period of more than 20 µs. The compensation circuit may therefore be configured to determine the power dissipation in the output stage over time and to determine whether the power dissipation is acceptable over a given time period. The output stage is then controlled based on whether the power dissipation is acceptable for the given time period. For example, the compensator circuit may be configured to control the output stage by interrupting operation of the output stage or by reducing its control input to the output stage in response to the power dissipation exceeding an acceptable limit for a period of time. In the preceding example, if the compensation circuit detects a 10 W power dissipation for a period of 10 µs, then the compensation circuit will take no action since the output stage can tolerate a 10 W power dissipation for a period of up to 20 µs. By contrast, the compensation circuit may continuously detect a 10 W power dissipation for a period approaching 20 µs. At the 20 µs mark, the compensation circuit may control the output stage by interrupting operation of the output stage or by reducing or otherwise adjusting the control input to the output stage. In some implementations, the compensation circuit may control the output stage by discontinuing the supply voltage to the output stage. For example, the compensation circuit may control the voltage regulator 67 to cease providing a voltage or to reduce the magnitude of the voltage provided. For example, the compensation circuit may control the envelope tracker (tracking circuit 76) to cease providing the supply voltage or to reduce the magnitude of the supply voltage.

Figure 3:
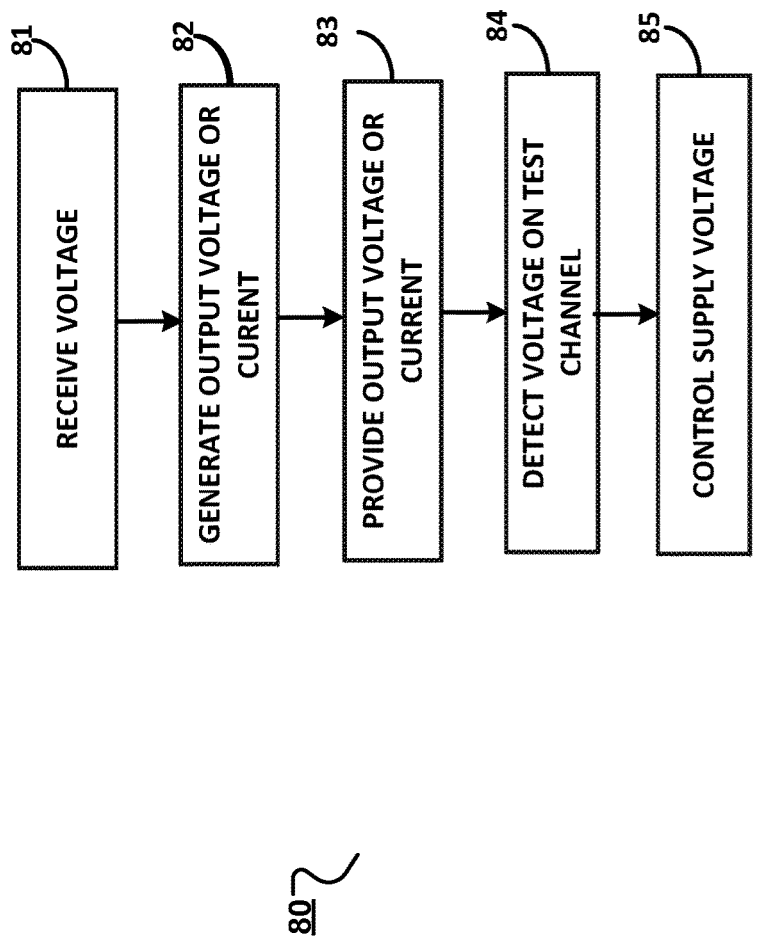
FIG. 3 is a flowchart showing operations in an example process for controlling power dissipation in an output stage of the test channel.

Referring to FIG. 3, a process 80 for controlling a test channel includes, but is not limited to, the following operations. The process includes receiving (81) voltage as an input to a test system. For example, the voltage may be programmed into the test computer by a user, such as a test engineer. The voltage is the target forced voltage for output on a test channel of interest. The process includes generating (82) a current output based on the voltage input. In some implementations, the current may be programmed into the test computer by a user, such as a test engineer, and the voltage may be the unknown that is determined. The voltage and the current are provided as output (83) to the test channel as part of the testing process. The envelope tracker detects (84) the voltage on the test channel output from or following the output stage and controls (85) the supply voltage to the output stage based on the channel voltage and the overhead voltage of the output stage. For example, the envelope tracker may limit the supply voltage to a value that is based on a sum of the channel voltage and an overhead voltage for the output stage. The value may be a voltage that is equal to that sum, a voltage that exceeds that sum, or a voltage that is a multiple of that sum. The smaller the difference between the channel voltage and the supply voltage, the smaller in physical size the output stage can be. Generally speaking, for smaller output stages, higher-density testing can be implemented with less cost and space.

The example systems and processes described herein may be used with any appropriate test system. For example, the systems and processes may be used with a high-voltage, moderate-current test instrument, where an example high-voltage is 100V or more and where an example moderate-current is 2 A pulsed or less. For example, the systems and processes may be used with a high-voltage, moderate-current test instrument, where an example high-voltage is 100V or more and where an example moderate-current is 2 A pulsed or more. For example, the systems and processes may be used with a high-voltage, moderate-current test instrument, where an example high-voltage is 50V or more and where an example moderate-current is 2 A pulsed or less. For example, the systems and processes may be used with a high-voltage, moderate-current test instrument, where an example high-voltage is 50V or more and where an example moderate-current is 2 A pulsed or more. Pulsed current includes current that is greater than the current that the output stage can accommodate without damage for longer periods of time, but that the output stage can accommodate without damage for shorter periods of time. In an example, pulsed current includes applying a current, such as 2 A or 3 A, for a period of 1 millisecond (ms). In an example, this current can be repeated—that is, pulsed—for 1 ms at regular time periods.

All or part of the test systems and processes described in this specification and their various modifications may be configured or controlled at least in part by one or more computers using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test systems and processes can be performed by one or more programmable processors executing one or more computer programs to control all or some of the well formation operations described previously. All or part of the test systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A test system comprising:
   an output stage to receive a supply voltage and to source at least one of voltage or current to a channel of a test instrument;
   a tracking circuit to detect a channel voltage following the output stage and to control the supply voltage to reduce a voltage differential between the supply voltage and the channel voltage following the output stage while the output stage maintains a level of the at least one of voltage or current sourced to the channel of the test instrument; and
   a controller to determine a power dissipation of the output stage based on the supply voltage and the channel voltage, and to control the output stage based on the power dissipation of the output stage.

2. The test system of claim 1, wherein controlling the supply voltage comprises adjusting the supply voltage to track variations in the channel voltage.

3. The test system of claim 2, wherein the output stage operates based on an overhead voltage; and
   wherein controlling the supply voltage comprises limiting the supply voltage to a value that is based on a sum of the channel voltage and the overhead voltage.

4. The test system of claim 3, wherein the value of the supply voltage is equal to the sum of the channel voltage and the overhead voltage.

5. The test system of claim 1, wherein the smaller the output stage is in size, the less power dissipation that the output stage will tolerate, with a maximum power dissipation of the output stage being based on the supply voltage, the channel voltage, and a current from the output stage.

6. The test system of claim 1, further comprising:
   a current sensor to detect an output current from the output stage; and
   wherein the controller comprises a compensator circuit configured to determine the power dissipation based also on the output current.

7. The test system of claim 6, wherein the compensator circuit is configured to determine the power dissipation by performing operations comprising:
   obtaining a difference voltage between the supply voltage and the channel voltage; and
   obtaining a product of the output current and the difference voltage.

8. The test system of claim 6, wherein the compensator circuit is configured to determine the power dissipation over time and to determine whether the power dissipation is acceptable for the time; and
   wherein the output stage is controlled based on whether the power dissipation is acceptable for the time.

9. The test system of claim 8, wherein the compensator circuit is configured to control the output stage by interrupting operation of the output stage in response to the power dissipation exceeding an acceptable limit for a period of time.

10. The test system of claim 6, wherein the compensator circuit is configured to compare the power dissipation to a predefined power dissipation and, if the power dissipation exceeds the predefined power dissipation, to control the output stage by interrupting operation of the output stage.

11. The test system of claim 1, wherein the tracking circuit is configured to provide an input voltage to the output stage, the at least one of voltage or current being based on the input voltage; and
    wherein controlling the output stage comprises changing the input voltage based on the power dissipation.

12. The test system of claim 1, wherein the tracking circuit is configured to change the supply voltage in a duration measured within single or double digit microseconds of the channel voltage being tracked changing.

13. The test system of claim 1, wherein the tracking circuit is configured to control the supply voltage to limit the voltage differential between the supply voltage and the channel voltage.

14. The test system of claim 1, wherein the voltage sourced is at least 100 volts and the current sourced is at least 2 amperes pulsed.

15. The test system of claim 1, wherein a size of the output stage is proportional to a difference between the supply voltage and the channel voltage at a maximum current through the output stage.

16. The test system of claim 15, wherein a reduction in a difference between the supply voltage and the channel voltage at the maximum current enables a reduction in a size of the output stage.

17. A test system comprising:
    test instruments to send signals to, and to receive signals from, a device under test (DUT), each test instrument comprising one or more channels, a channel among the one or more channels comprising an output stage to source at least one of voltage or current, the output stage to receive a supply voltage;
    a device interface board (DIB) for connecting one or more of the test instruments to the DUT both electrically and mechanically; and
    a computing system to control operation of one or more of the test instruments;
    wherein the channel comprises:
       a tracking circuit to reduce a voltage differential between the supply voltage and a channel voltage on the channel while the output stage maintains a level of the voltage or the current sourced to the channel of the test instrument; and a controller to control the output stage based on a power dissipation in the output stage.

18. The test system of claim 17, wherein the output stage is configured to receive an input voltage and to source the at least one of voltage or current based on the input voltage; and wherein the controller is configured to control the output stage by changing the input voltage.

19. The test system of claim 17, wherein the controller comprises a compensator circuit that is configured to determine the power dissipation in the output stage by performing operations comprising:

obtaining a difference voltage between the supply voltage and the channel voltage; and obtaining a product of the difference voltage and a channel current on the channel.

20. The test system of claim 17, wherein the controller is configured to determine the power dissipation over time and to determine whether the power dissipation is acceptable for the time; and wherein the controller is configured to control the output stage based on whether the power dissipation is acceptable.

21. The test system of claim 20, wherein the controller is configured to control the output stage by interrupting operation of the output stage in response to the power dissipation exceeding an acceptable limit for a period of time.

22. The test system of claim 18, wherein the controller is configured to compare the power dissipation to a predefined power dissipation and, if the power dissipation exceeds the predefined power dissipation, to control the output stage by interrupting operation of the output stage.

23. The test system of claim 22, wherein interrupting operation of the output stage comprises adjusting input of voltage to the output stage from the controller.

24. The test system of claim 17, wherein a size of the output stage is proportional to a difference between the supply voltage and the channel voltage at a maximum current through the output stage.

25. The test system of claim 24, wherein a reduction in a difference between the supply voltage and the channel voltage at the maximum current enables a reduction in a size of the output stage.

26. The test system of claim 17, wherein the smaller the output stage is in size, the less power dissipation that the output stage will tolerate, with a maximum power dissipation of the output stage being based on the supply voltage, the channel voltage, and a current from the output stage.

* * * * *